Jan. 15, 1957
W. D. GABOR
CONTROLLABLE INDUCTOR OSCILLATOR
WITH BRIDGE CONTROL CIRCUIT
Filed Dec. 29, 1953
2,777,955
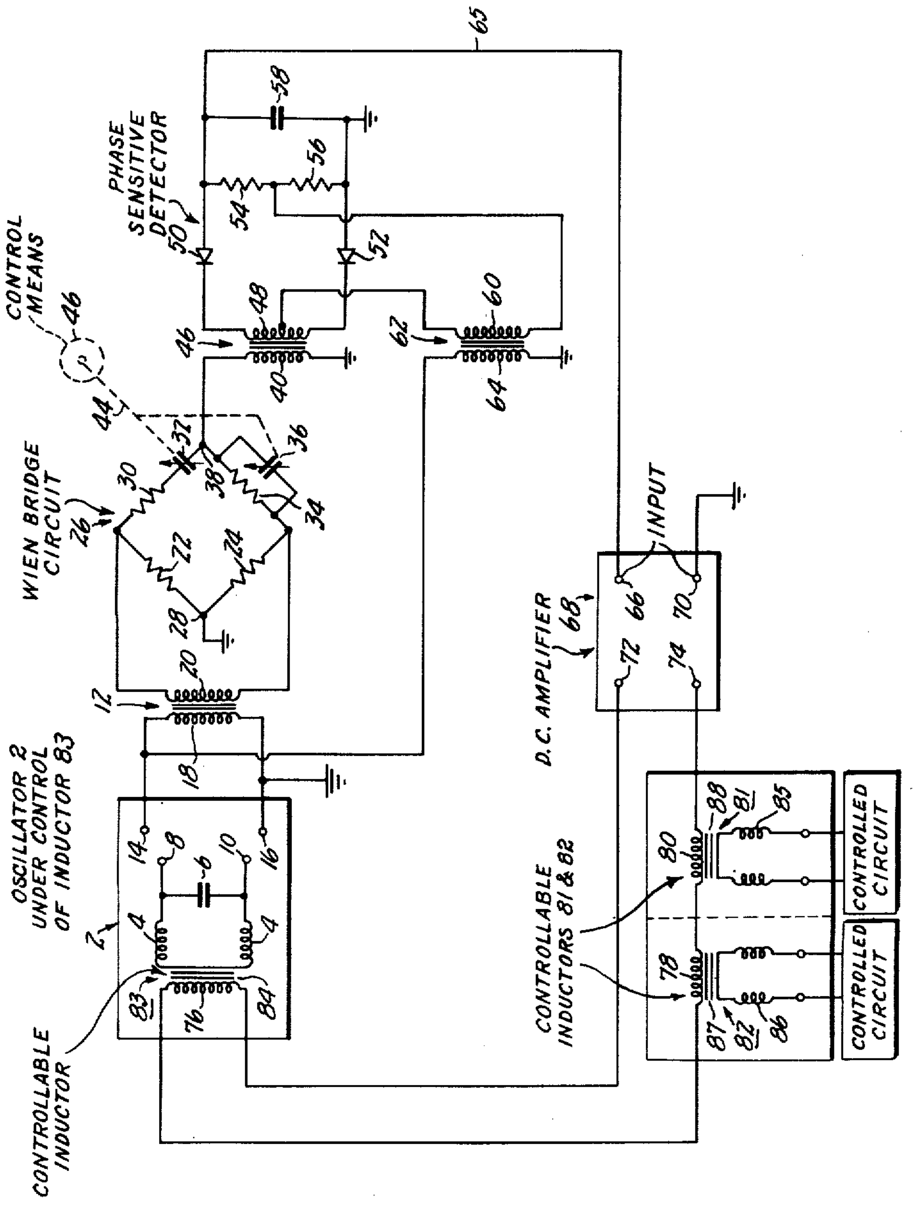
INVENTOR
WILLIAM G. GABOR
BY
Curtis, Morris & Safford
ATTORNEYS 2,777,955
Patented Jan. 15, 1957

2,777,955

CONTROLLABLE INDUCTOR OSCILLATOR WITH BRIDGE CONTROL CIRCUIT

William D. Gabor, Norwalk, Conn., assignor to C. G. S. Laboratories, Inc., Stamford, Conn., a corporation of Connecticut Application December 29, 1953, Serial No. 400,839

7 Claims. (Cl. 250—36)

This invention relates to apparatus for producing electric oscillations, and more particularly to such a system wherein a plurality of tuned circuits automatically track a stabilized, variable-frequency oscillator.

Because of such problems as tube ageing, temperature and humidity variations, and shock and vibration conditions, variable-frequency oscillators have proven generally to be relative unstable. That is, the frequency of oscillations generated by such apparatus changes with the passage of time or under adverse environmental conditions such as might be encountered in military service or in certain commercial applications. Furthermore, when the oscillator utilizes inductors wound on ferrite ceramic cores, such as disclosed by Dewitz in patent application Serial Number 213,548, filed March 2, 1951, the effects of temperature variations become even more pronounced, and additionally the hysteresis characteristics of such cores make it difficult to adjust the frequency accurately.

In some particular applications, it is necessary to have a number of tuned circuits or a number of variable-frequency oscillators operating together on the same frequency. For this purpose, it is possible to control the frequency of each such circuit oscillator by means of a separate stabilizing circuit, each of the latter being ganged together in some manner. This approach tends to avoid the hysteresis effects mentioned previously, but in an exceedingly complex and expensive way, and additionally the problems of ganging the control mechanism introduce further errors. For these reasons, it is desirable to arrange the system so that only one master oscillator is stabilized, with the remaining oscillators caused to track the master oscillator by electrical means.

Correspondingly, it is often desirable to have a single-stage or multi-stage receiver where the tuning of each stage is centered on the frequency of a variable-frequency transmitter. For particular applications of such equipment, for example, where the transmitter frequency is caused to vary widely and rapidly and where there is little time available to carry out tedious receiver tuning adjustments, it is almost mandatory that the receiver tuning be tracked with the transmitter frequency by automatic electrical means.

Other objects and advantages of this invention will be in part apparent from, and in part pointed out in, the following specification taken together with the accompanying drawing which is a schematic and block diagram of one embodiment of the invention.

In the drawing, a block 2 is representative of a variable-frequency oscillator. A winding 4 in parallel with a capacitor 6 forms a resonant circuit for the oscillator which is connected to the terminals 8 and 10 merely to indicate electrical continuity with the remainder of the oscillator circuitry. This circuitry may be of conventional form well known in the art, and will generally include a non-linear element such as a vacuum-tube or transistor.

A winding 18 of an output transformer 12 is connected between two output terminals 14 and 16 of the oscillator 2. Terminal 16 is also connected to a common ground circuit.

The secondary winding 20 of the transformer 12 is connected across opposite terminals of a Wien bridge circuit generally indicated at 26. One arm of this bridge comprises a resistor 22 in series with a resistor 24, the junction of the two resistors being grounded, as at 28. The other arm of the bridge comprises a resistor 30 and a variable capacitor 32 connected in series with the parallel combination of a resistor 34 and a variable capacitor 36; the junction 38 of the capacitor 32 and the parallel circuit is connected through the primary winding 40 of a transformer 42 to the common ground circuit. The two variable capacitors 32 and 36 are linked together mechanically by a ganging mechanism, indicated by the broken lines 44, which in turn is connected to an adjustment device 46. The Wien bridge provides a sharp null-output between center points 38 and 28 at a particular frequency determined by the combination of parameter values chosen for the resistors and capacitors. In the embodiment shown, the resistor 22 has a resistance twice that of the resistor 24, resistor 34 is equal to resistor 30, and capacitor 36 is equal to capacitor 32. In these circumstances, the null frequency of the bridge is inversely proportional to the capacitance value of capacitor 36 or 32. The linkage mechanism 44 is arranged to track the two capacitors together, in order to retain their relationship of equality.

The secondary winding 48 of the transformer 42 is connected into a phase-sensitive detector consisting of two half-wave rectifiers 50 and 52, in the series with the parallel combination of two series resistors 54 and 56 and a capacitor 58. A center tap on the winding 48 and the junction of the two resistors 54 and 56 are connected, respectively, to opposite ends of a primary winding 60 of a transformer 62. The secondary winding 64 of this transformer is connected between ground and the terminal 14 of the oscillator 2.

When the frequency of the oscillator signal at terminal 14 is equal to the null frequency of bridge 26, there will be no output voltage at the junction point 38. Accordingly, the rectifiers 50 and 52 will conduct equal amounts of current because of their balanced arrangement with respect to the output of transformer 60. However, when the oscillator frequency differs from that of the null frequency of the bridge, there will be an alternating voltage at the junction point 38, and correspondingly a voltage will be induced in the winding 48 of the transformer 42 due to current flow through winding 40.

The phase of the induced voltage in winding 48 will depend upon whether the oscillator frequency is above or below that of the bridge null frequency. Therefore, because of the phase relationship, the voltage induced in the winding 48 will aid the output of the transformer 62 with respect to one of the non-linear elements 50 or 52, and will oppose it with respect to the other. So that, if, for example, the oscillator frequency is higher than the null frequency, one of the rectifiers will conduct more current than the other, but if the oscillator frequency is lower, then the other rectifier will conduct the greater current.

Consequently, any difference between the oscillator frequency and the null frequency will result in a direct current potential appearing across capacitor 58. The polarity of this potential will be, for example, positive if the oscillator frequency exceeds the null frequency, and negative for the reverse condition.

The voltage across the capacitor 58 is connected through a lead 65 to an input terminal 66 of a direct current amplifier, generally indicated by the block 68, and through the common ground circuit to the other input terminal 70 of the amplifier. This amplifier can be any one of the types well known in the art, such as those employing vacuum-tubes, transistors, magnetic devices and the like. It is preferable, however, that the output circuitry of this amplifier be arranged to supply a controlled current to the output load.

Two output terminals 72 and 74 of the amplifier 68 are connected in series with three control windings 76, 78, and 80 of three controllable inductors 81, 82, and 83, respectively. The winding 76 of inductor 83 is on a common magnetic core with the winding 4, which is wound on a saturable ferrite core 84. Variations in the current through the winding 76 causes a corresponding variation in the magnetic saturation of the core 84 and thereby varies the effective inductance of the winding 4: this in turn controls the frequency generated by the oscillator 2.

The control windings 78 and 80 perform the same function as winding 76. They are wound, respectively, on magnetic circuits common to two signal windings 85 and 86 which are wound on saturable cores 87 and 88 of ferrite material. The inductors 81 and 82 can be connected to any desired circuits. They may form, for example, the variable inductors of two tuned amplification stages of a receiver (not shown), or they may control the resonant circuits of two oscillators similar in form to that of the master oscillator of block 2. In either event, windings 85 and 86 are connected as part of respective resonant circuits, so that the tuning of such resonant circuits will be controlled by the current passing through windings 78 and 80.

In operation, if the oscillator 2 is putting out a signal of frequency equal to that of the bridge null frequency, there will be no change in the correction signal fed back to the control winding 76. Since the current passing through that winding is equal to the current passing through windings 78 and 80, the tuned circuits associated with the latter windings can be arranged to maintain the same frequency as that appearing on terminal 14. If the capacitors 32 and 36 are reset to provide a different bridge null frequency, the correction signal current will change, and will alter the current through the winding 76 so as to reset the oscillator frequency to the bridge null frequency. Correspondingly, the alteration of current through windings 78 and 80 will retune the resonant circuits, of which windings 82 and 84 form a part.

If the windings 85 and 86 are taken to represent tuned stages of a receiver, the system can automatically and continuously maintain the receiver tuned to the frequency of oscillator 2. The hysteresis effects present in the saturable core material of windings 4, 85 and 86 will not disturb the functioning of the system, since the magnetic history (that is, the prior flux variations) of each core will be identical. Hence, since the master oscillator is stabilized to the bridge null frequency, the resonant circuits 85 and 86 of controllable inductors 81 and 82 will also continuously track this frequency. And if, as is usual, cores 87 and 88 are physically located adjacent the master oscillator 2, any inductance variations in the windings 85 and 86 due to temperature deviations will normally not disturb the tracking operation, since the temperature effects will also operate on the core 84 and thus will be cancelled out by virtue of the bridge stabilization system.

While the embodiment shown utilizes a manually-operable tuning control for adjusting capacitors 32 and 36, it is clear that this adjustment can be made in many ways including motor drive means. Furthermore, for high-speed frequency sweeps, it is possible to replace resistors 22 and 24 with vacuum tubes, such as triodes, and maintain control over their effective resistance by varying the control grid voltages. If the grid voltage of one is raised while the grid voltage of the other is lowered, there will be an effective change in the ratio of the tube resistance values. Accordingly, the tuning of the bridge circuit will be altered, thereby providing control over the oscillator output frequency. In addition, this approach operates to cancel out the normal tube non-linearities.

Another advantage of the system disclosed is that any drift effects in amplifier 68 will be substantially nullified. If the current output of this amplifier fluctuates because of ambient temperature changes, etc., the frequency of oscillator 2 would tend to vary, but due to the stabilization system a correction signal is immediately fed back to counteract this variation. If desirable for a particular application, however, the direct current amplifier 68 can be dispensed with by providing alternating current amplification between the bridge output and transformer 46, and in the comparison signal circuit which includes the transformer 62.

It will be clear that the circuits utilizing the windings 85 and 86 need not form parts of resonant circuits nor do they need to operate at the frequency of the master oscillator 2. For example, the oscillator 2 may be operated at a constant frequency. If the cores 87 and 88 are subjected to the same thermal conditions as the core 84, the system will compensate for changes inductance of the windings 85 and 86 that would otherwise occur with changes in the temperature. Separate additional control windings may be provided to provide an operating control of the flux in the cores 87 and 88.

I claim:

1. Apparatus for stabilizing a tuned circuit comprising a signal generator, a resonant tuned circuit associated with the generator and including a first controllable inductor wound on a saturable ferrite core, an output circuit for the generator, a bridge circuit coupled to the generator output circuit, a phase-sensitive detector coupled to the generator output circuit and to the output of the bridge circuit, said detector including at least one non-linear circuit element, a feed-back circuit coupling the detector output to said control winding, and a second controllable inductor having a control winding connected to said feed-back circuit.

2. Apparatus for stabilizing a tuned circuit comprising a signal generator, a resonant tuned circuit associated with the generator and including a controllable inductance wound on a saturable ferrite core, a control winding magnetically associated with said core, an output circuit for the generator, a Wien bridge coupled to the generator output circuit, a phase-sensitive detector coupled to the generator output circuit and to the output of the Wien bridge, said detector including at least one non-linear circuit element, and a feed-back circuit coupling the detector output to said control winding.

3. Apparatus for stabilizing a tuned circuit comprising a signal generator, a resonant tuned circuit associated with the generator and including a controllable inductance wound on a saturable ferrite core, a control winding magnetically associated with said core, an output circuit for the generator, a bridge coupled to the generator output circuit, a phase-sensitive detector coupled to the generator output circuit and to the output of the bridge, said detector including a rectifier and a filter circuit, and a feed-back circuit coupling the detector output to said control winding.

4. Apparatus for stabilizing a tuned circuit comprising a signal generator, a resonant tuned circuit associated with the generator and including a controllable inductance wound on a saturable ferrite core, a control winding magnetically associated with said core, an output circuit for the generator, a Wien bridge coupled to the generator, a phase-sensitive detector coupled to the generator and to the output of the Wien bridge, said detector including at least one non-linear circuit element, a feed-back circuit coupling the detector output to said control winding, and a plurality of electrically controllable inductors each having a control winding connected to said feed-back circuit.

5. Apparatus for stabilizing a tuned circuit comprising a signal generator, a resonant tuned circuit associated with the generator and including a controllable inductance wound on a saturable magnetizable core, a control winding around said core for varying the magnetic saturation of said core, a balanceable bridge circuit coupled to the generator, a phase-sensitive detector coupled to the generator and to the output of the bridge, and a feedback circuit coupling the detector output to said control winding.

6. Variable frequency control apparatus comprising a variable frequency signal generator including a frequency control controllable inductor having a core of magnetizable material and signal and control windings on said core, a Wien bridge connected to the output of said signal generator, a phase-sensitive detector connected to the output of said Wien bridge and to said generator, amplification means connected to the output of said phase-sensitive detector, circuit means connecting the amplified signal from said amplification means to said control winding of said frequency control inductor, a plurality of controllable inductors each having a core of magnetizable material and a signal winding and a control winding thereon, and a circuit means connecting each of said control windings of said plurality of controllable inductors to said amplification means.

7. Variable frequency control apparatus comprising a signal generator, a resonant tuned circuit associated with the generator and including a frequency control controllable inductor having a core of magnetizable material and an electromagnetic control circuit, a Wien bridge connected to the output of said signal generator and including a variable impedance member, a phase-sensitive detector connected to the output of said Wien bridge and to said generator, first circuit means coupling the signal from said detector to said electromagnetic control circuit of said frequency control inductor, a second controllable inductor having a core of magnetizable material and a signal winding and a control winding thereon, second circuit means connecting each of said control winding of said second controllable inductor to said first circuit means, a controlled circuit coupled to said signal winding, and a control means connected to said variable impedance member.

References Cited in the file of this patent

UNITED STATES PATENTS 1,788,533 Marrison -------------- Jan. 13, 1931

FOREIGN PATENTS 644,083 Great Britain ----------- Oct. 4, 1950

U. S. DEPARTMENT OF COMMERCE

PATENT OFFICE

CERTIFICATE OF CORRECTION

Patent No. 2,777,955 January 15, 1957

William D. Gabor

It is hereby certified that error appears in the printed specification of the above numbered patent requiring correction and that the said Letters Patent should read as corrected below.

Column 4, line 28, after "core," insert -- a control winding magnetically associated with said core, --; column 6, line 12, claim 7, strike out "each of".

Signed and sealed this 18th day of March 1958.

(SEAL)
Attest:

KARL H. AXLINE

Attesting Officer

ROBERT C. WATSON
Commissioner of Patents